United States Patent [19]
Parthasarathi

[11] Patent Number: 5,650,663
[45] Date of Patent: Jul. 22, 1997

[54] ELECTRONIC PACKAGE WITH IMPROVED THERMAL PROPERTIES

[75] Inventor: Arvind Parthasarathi, North Branford, Conn.

[73] Assignee: Olin Corporation, Cheshire, Conn.

[21] Appl. No.: 497,836

[22] Filed: Jul. 3, 1995

[51] Int. Cl.$^6$ .............................. H01L 23/10; H01L 23/34
[52] U.S. Cl. .................... 257/706; 257/675; 257/710; 257/787; 257/796
[58] Field of Search ........................... 257/787, 675, 257/710, 706, 70, 779, 796; 174/52.4

[56] References Cited

U.S. PATENT DOCUMENTS

| | | | |
|---|---|---|---|
| 3,702,427 | 11/1972 | Learn et al. | 257/734 |
| 4,495,378 | 1/1985 | Dötzer et al. | 174/68.5 |
| 4,577,056 | 3/1986 | Butt | 174/52 FP |
| 4,939,316 | 7/1990 | Mahulikar et al. | 174/52.4 |
| 4,967,260 | 10/1990 | Butt | 257/678 |
| 5,013,871 | 5/1991 | Mahulikar et al. | 174/52.4 |
| 5,025,114 | 6/1991 | Braden | 174/52.4 |
| 5,034,591 | 7/1991 | Fang | 174/52.4 |
| 5,132,773 | 7/1992 | Braden et al. | 257/678 |
| 5,367,196 | 11/1994 | Mahulikar et al. | 257/787 |

*Primary Examiner*—Mahshid D. Saadat
*Assistant Examiner*—T. M. Arroyo
*Attorney, Agent, or Firm*—Todd E. Garabedian; Gregory S. Rosenblatt; Wiggin & Dana

[57] ABSTRACT

An electronic package having improved thermal performance. In the case of a plastic package, the inner ends of the leads of the lead frame are attached to a heat slug by a high thermal conductivity material such as solder or a polymeric material. In the case of a metal package, the inner ends of the leads of the leadframe are attached to the metal base component by a high thermal conductivity material.

17 Claims, 1 Drawing Sheet

ELECTRONIC PACKAGE WITH IMPROVED THERMAL PROPERTIES

BACKGROUND OF INVENTION

1. Field of the Invention

This invention relates generally to an improved electronic package, and more particularly, to an electronic package having improved thermal properties.

2. Background

In the electronics industry, the rapid development and extensive use of integrated circuits, such as silicon based semiconductor devices, have resulted in the proliferation of package designs to house the electronic devices. The packages take many forms including those which may be broadly categorized as hermetic or non-hermetic.

Hermetic packages are generally formed from ceramic or metal components and are usually glass sealed. Non-hermetic packages are generally formed from ceramic, metal or plastic components and are usually epoxy sealed. Non-hermetic packages are also formed by molding a plastic body around the electronic device. All such packages may be characterized by having an electronic component such as a silicon based semiconductor device mounted within the package and a leadframe having inner lead ends within the package and adapted for connection to the electronic device by wire bonds. The leadframe also includes outer lead ends extending out from the package for connection to an external device.

During the use of the electronic packages, heat is generated by the electronic component. This heat must be dissipated, as the build up of heat in the package may result in damage to the operability of the electronic system or even the failure of the overall system in which the package is used. Heat removal from the metallic packages occurs predominantly by heat flow through the seal epoxy, particularly the layer of epoxy attaching the leadframe to the base. Since the epoxy has relatively poor thermal conductivity, this limits the thermal performance of the package. In the plastic packages, even those with a heat slug or heat spreader, there exists a similar problem. The heat has to flow through poorly conducting epoxy at some point.

SUMMARY OF THE INVENTION

In view of the above, it is an object of the present invention to provide an electronic package with improved thermal properties.

Another object of the present invention is to provide an electronic package of the type in which the electronic device is enclosed in plastic and which has improved thermal properties.

Yet another object of the present invention is to provide an electronic package of the type including a metallic base and cover enclosing the electronic device and which has improved thermal properties.

These and other objects and advantages of the present invention may be achieved in accordance with the present invention through the provision of an electronic package which comprises a substrate, an electronic device attached to said substrate, a lead frame having a plurality of leads having their inner ends wire bonded to said electronic device and their outer ends extending from said package, and a high thermal conductivity material connecting said inner ends of each said lead to the substrate.

BRIEF DESCRIPTION OF THE DRAWINGS

The objects and advantages of the present invention will become more apparent by reference to the following detailed description and to the accompanying drawings in which.

DETAILED DESCRIPTION

Figure 1:
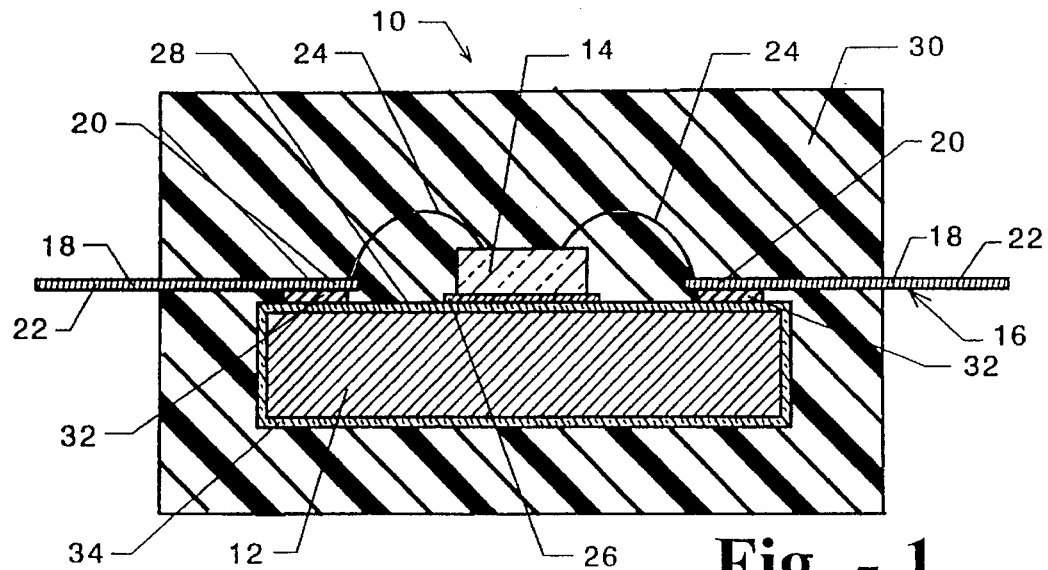
FIG. 1 is a cross-sectional representation of one type of an electronic package incorporating the principles of the present invention.

Referring to the drawings, and particularly FIG. 1, there is shown a typical plastic package 10 provided with a heat slug or heat spreading substrate 12 and incorporating the present invention. Such a package 10 is adapted to contain an electronic component 14 which may typically be a silicon based semiconductor device such as a chip or the like. A leadframe 16 is provided which is generally formed from an electrically conductive material such as copper, copper alloy or an iron-nickel alloy. In a known manner, the leadframe 16 includes a plurality of leads 18, each having an inner end 20 and outer end 22. The inner ends 20 of the leads 18 are disposed about the electronic component 14 and are connected thereto by wire bonds 24. The outer ends 22 of the leads 18 are adapted for connection to an external device such as a printed circuit board. A suitable adhesive or die attach 26 bonds the electronic device 14 to the top surface 28 of heat slug 12 as shown.

As shown in FIG. 1, a solid plastic body 30 encases the electronic component 14, the heat slug 12, the wire bonds 24 and a portion of the leads 18. The plastic body 30 may be formed by injecting any one of the various well-known plastic molding compounds into a mold around the electric device 14, heat slug 12, wire bonds 24 and the portion of the leads 18 to be encased.

In accordance with the present invention, the end portion of the inner end 20 of each of the leads 18 is connected to the periphery of the upper surface 28 of the heat slug 12 by a high heat conductivity attachment material 32 such as solder or high thermal conductivity polymeric material. Solder is preferred for its high thermal conductivity although such polymeric materials as polymer thick film or die attach materials may also be used.

For best thermal performance, the heat slug 12 and leads 18 should also have a relatively high thermal conductivity. For this reason, the preferred materials for the heat slug 12 include aluminum or aluminum alloys with an electrically insulating anodized coating 34 thereon, and also copper alloys with an electrically insulating nitride, oxide, carbide or similar coating 34. Other materials which may be used for the heat slug 12 include copper and aluminum based metal matrix composites. The lead frame 24 may be formed from an electrically conductive material such as copper, copper alloy or an iron-nickel alloy, which may additionally have a plating thereon of different metals such as copper, silver, nickel, gold or palladium, or combinations thereof. The preferred material for the lead frame 24 is copper or copper alloys.

The solder used for the attachment material 32 may be any solder with a higher melting point than the conventional eutectic Sn/Pb solders. The solder should thus have a higher melting point than that used for the subsequent operations such as attachment of the package 10 to a circuit board. The particular solder used may have a melting point of about 230° C. or above, and preferably a melting point in the range of about 250° C. to about 300° C. The use of a soft solder, such as those having a melting point in the range of about 250° C. to about 300° C., will accommodate any stress due to any thermal mismatch if different materials are used for the lead frame 16 and heat slug 12 as in the case where the leadframe 16 is copper and the heat slug 12 is aluminum.

If solder is used as the attachment material 32, the heat slug 12 will first have to be selectively metalized to obtain a pattern of discrete lands matching the inner lead pattern on the leadframe. This may be achieved by plating, vapor deposition or the like. One suitable technique is to apply a photoresist to the substrate and use a mask to expose the photoresist in the pattern of the inner lead ends.

If a conductive polymer is used for the attachment material 32, metalization of the surface of the heat slug 12 is not necessary. In this case, small discrete gobs of a conductive polymer paste may be dispensed on the heat slug 12 in a pattern matching the pattern of the inner ends 20 of the leads 18. This may be accomplished by screen printing, pattern dispensing, or the like. The inner ends 20 of the leads 18 may then be partially impressed into the discrete gobs and permanently attached by curing the polymer. Examples of conductive polymers include silver filled epoxies used as die attach materials and polymer thick films.

After the leadframe 16 and heat slug 12 are attached through the attachment material 32, the electronic component 14 such as a silicon chip may be die attached to the center of the upper surface 28 of the heat slug 12 in a conventional manner using a conventional polymeric or solder die attach material 26. If a solder die attach material is used, the portion of the heat slug 12 under the electronic component 14 must be metalized, or an opening must be provided in the coating 34 on the heat slug 12 in that area. The inner ends 20 of the leads 18 of the leadframe 16 may then be wire bonded to the electronic device in the conventional manner by the wire bonds 24 and the assembly encased with the plastic body 30.

When the assembly is completely encapsulated in the plastic body 30, the resulting plastic package 10 will be provided with a low resistance thermal path for heat removal. Heat flow will predominantly occur from the electronic component 14 down into the heat slug 12 and out through the leads 18 into the board to which the package 10 is attached.

Figure 2:
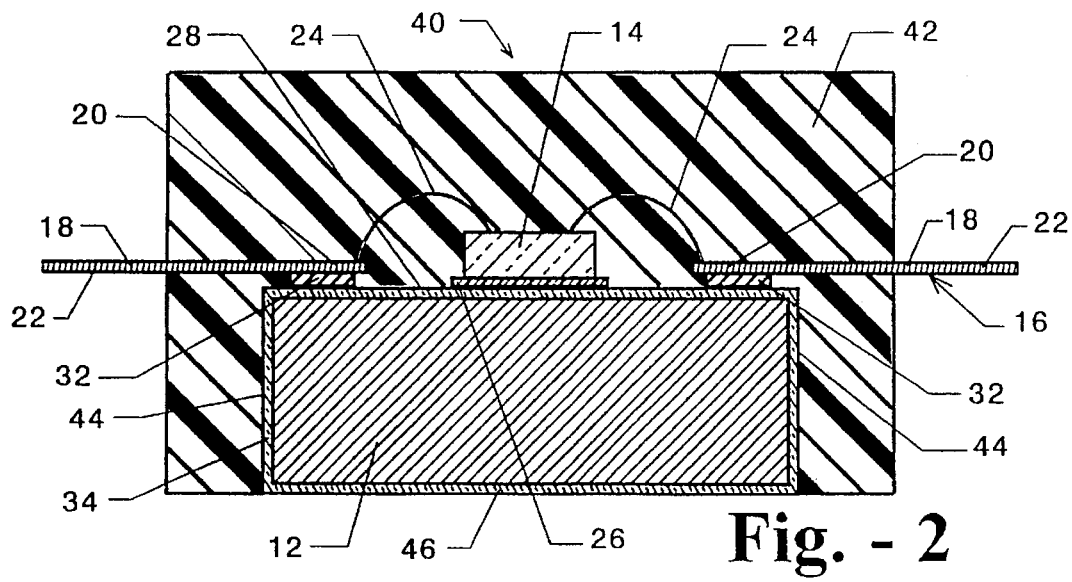
FIG. 2 is a cross-sectional representation of another type of electronic package incorporating the principles of the present invention.

As an alternative to the above-described construction, the heat slug or spreading substrate 12 may be partially exposed as shown in the embodiment of FIG. 2. As shown in FIG. 2, the package 40 is similar to the package 10 of FIG. 1 in that it includes a leadframe 16 having a plurality of leads 18, each having an inner end 20 and outer end 22. The inner ends 20 of each of the leads 18 are disposed about the electronic component 14 and are connected thereto by wire bonds 24. The outer ends 22 are adapted for connection to an external device such as a printed circuit board. A suitable adhesive or die attach 26 bonds the electronic device 14 to the center of the upper surface 28 of the heat slug or heat spreading substrate 12 as shown.

As in the case of the package 10 of FIG. 1, the package 40 of FIG. 2, in accordance with the present invention, the end portion of the inner end 20 of each of the leads 18 is connected to the periphery of the upper surface 32 of the heat slug 12 by a high heat conductivity attachment material 32 such as solder or high-conductivity polymeric material. The materials used for the various components of the package 40, including the leads 18, heat slug 12 and attachment material 32 are the same as that used in the embodiment of FIG. 1.

However, in the case of the package 40 of FIG. 2, a plastic body 42 only encases the sides 44 and top surface 28 of the heat slug 12 as well as the electronic component 14 and inner ends 20 of the leads 18. The bottom surface 46 of the heat slug 12 is not covered, leaving the bottom surface 44 exposed for attachment to a heat sink to aid in heat removal.

Figure 3:
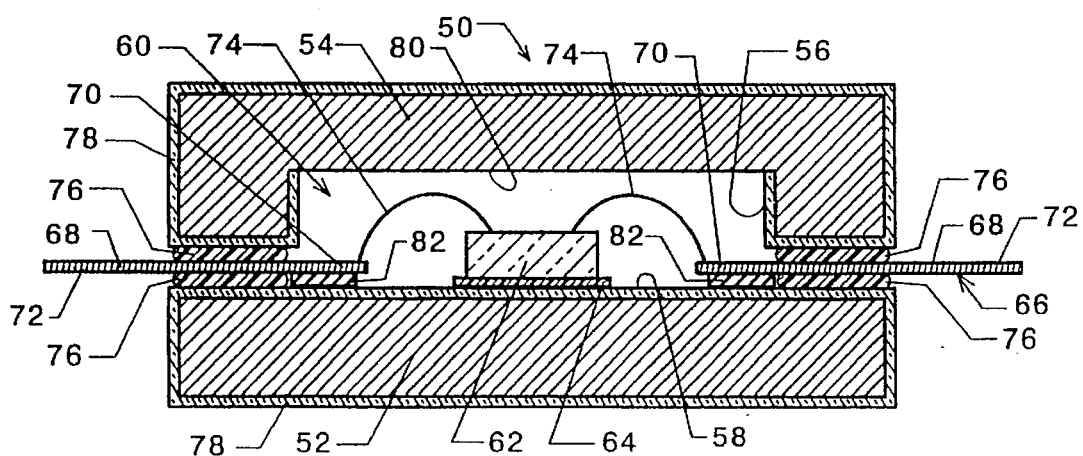
FIG. 3 is a cross-sectional representation of a third type of electronic package incorporating the principles of the present invention.

A third embodiment of the invention is shown in FIG. 3. In this case, the package 50 shown is of the type know as a metal quad pack such as shown in U.S. Pat. No. 4,939,316 to Mahulikar et al. The package 50 includes a metal base component 52 and a metal cover component 54. The base component 52 and the cover component 54 may be manufactured from aluminum or an aluminum alloy. Aluminum alloys designated by the ASM (American Society for Metals) as 3xxx series are preferred. These alloys contain up to about 1.5% weight manganese along with other alloying elements. A most preferred aluminum alloy is aluminum alloy 3003 having a nominal composition of about 0.12% by weight copper, about 1.2% by weight manganese and the balance aluminum.

The cover component 54 is provided with an internal depression 56 as shown. The base component 52, while shown as having a flat interior surface 58, may optionally also be provided with an internal depression. The depression 56 serves to form a cavity 60 for encasing an electronic component 62 which is connected to the interior surface 58 of the base component 52 by a suitable die attach 64. The electronic component 62 may typically be an integrated circuit such as a silicon based semiconductor device.

A leadframe 66 is disposed between the base component 52 and the cover component 54. The leadframe 66 comprises a plurality of leads 68 each having an inner lead end 70 and an outer lead end 72. Each of the inner lead ends 70 is connected to the electronic component 62 by a wire bond 74. The outer lead ends 72 are adapted for connection to an external device such as a printed circuit board (not shown). The lead frame 66 may be formed from an electrically conductive material such as copper, copper alloy or an iron-nickel alloy, which may additionally have a plating thereon of different metals such as copper, silver, nickel, gold or palladium, or combinations thereof.

The lead frame 66 is sealed to the base component 52 and cover component 54 by bonding layers 76. The bonding layers 76 may be any adhesive known in the art and are commonly a polymer adhesive such as a thermosetting or thermoplastic resin. A resin adhesive such as an epoxy, for example, Ablestik 550K manufactured by Ablestik Laboratories of Gardena, Calif. is one exemplary bonding material.

At least a portion of the base component 52 and the cover component 54 may be provided with an anodization layer 78. As shown, the entire outer surface of the base component 52 is provided with the anodization layer 78, while the entire surface, except for the bottom 80 of the depression 56 of the cover component 54, is provided with the anodization layer 78. The anodization layer 78 may have a thickness of from about 10 microinches to about 2000 microinches. The anodization layer 78 may be applied by any conventional technique. Using an aqueous solution containing about 20% by volume sulfuric acid at a temperature of about 20° C. deposits a satisfactory anodized layer on the surface of an anodically charged substrate.

In accordance with the present invention, the end portion of the inner ends 70 of each of the leads 68 is connected to the upper surface 58 of the base member 52 by a high heat conductivity attachment material 82 such as solder or high-conductivity polymeric material. As in the case of the previous embodiments, solder is preferred for its high thermal conductivity although such polymeric materials as polymer thick film or die attach materials may also be used. The attachment material 82 may be restricted to the inner tips of the inner ends 70 of the leads 68 or it may extend partially or fully through the seal area of the bonding material 76. The attachment material 82 may be applied and the leads connected to the base member 52 in the same manner as the attachment of the leads 18 to the substrate 12 by the attachment material 32 in the previous embodiments.

The use of the attachment material 32 or 82 for connecting the leads 18 or 72 of the lead frame to either a heat slug 12 or base component 52 as described above will provide a heat path for heat to flow from the electronic component 14 or 62 out through the leads. This will result in improved thermal properties for the electronic package. The present invention is not restricted to QUAD packs having lead ends approaching the electronic component from all four sides. Dual in line packages DIPs may also be produced in accordance with the principals of the present invention.

All patents set forth in this applications are intended to be incorporated by reference herein in their entirety.

While the invention has described above in connection with various embodiments thereof, it is evident that many alternatives, modifications and variations will be apparent to those skilled in the art. Accordingly, it is intended to embrace all such alternatives, modifications and variations as fall within the spirit and broad scope of the appended claims.

What is claimed is:

1. An electronic package comprising:

a. a heat spreading substrate, b. an electronic device attached to said heat spreading substrate, c. a lead frame having a plurality of leads having their inner ends wire bonded to said electronic device and their outer ends extending from said package, and d. a high thermal conductivity material selected from the group consisting of solders and conductive polymers connecting said inner ends of each said lead to the heat spreading substrate.

2. The electronic package of claim 1 wherein said heat spreading substrate, said electronic device and said inner ends of said leads are encased in a plastic body.

3. The electronic package of claim 1 wherein said high thermal conductivity material is solder.

4. The electronic package of claim 3 wherein said solder attaching said inner ends of said leads to said substrate has a melting point of about 230° C. or above.

5. The electronic package of claim 3 wherein said solder attaching said inner ends of said leads to said substrate has a melting point of from about 250° C. to about 300° C.

6. The electronic package of claim 1 wherein said high thermal conductivity material is a high thermal conductivity polymeric material.

7. The electronic package of claim 1 wherein said electronic device, the inner ends of said leads and said heat spreading substrate are encased in a plastic body.

8. The electronic package of claim 1 wherein said electronic device, the inner ends of said leads and the side walls and top surface of said heat spreading substrate are encased in a plastic body, with the bottom surface of said substrate exposed.

9. The electronic package of claim 1 wherein said heat spreading substrate is fabricated from aluminum, copper, or alloys thereof, and said lead frame is fabricated from copper, copper alloys or iron-nickel alloys.

10. The electronic package of claim 9 wherein said heat spreading substrate has an electrically insulating coating thereon.

11. An electronic package comprising:

a. a metal cover component, b. a metal base component, said base component and said cover component defining a cavity, c. an electronic component attached to said base component and positioned in said cavity, d. a lead frame disposed between and adapted to be bonded to said cover and base components and having inner lead ends, and e. a high thermal conductivity material selected from the group consisting of solders and conductive polymers connecting said inner lead ends to said base component.

12. The electronic package of claim 11 wherein said high thermal conductivity material is solder.

13. The electronic package of claim 12 wherein said solder attaching said inner lead ends to said base component has a melting point of about 230° C. or above.

14. The electronic package of claim 12 wherein said solder attaching said inner ends of said leads to said base component has a melting point of from about 250° C. to about 300° C.

15. The electronic package of claim 11 wherein said high thermal conductivity material is a high thermal conductivity polymeric material.

16. The electronic package of claim 11 wherein said cover component and said base component are fabricated from aluminum or aluminum alloys and said lead frame is fabricated from copper, copper alloys or iron-nickel alloys.

17. The electronic package of claim 16 wherein at least a portion of the surface of the base component and cover component has an anodization layer thereon.

* * * * *